(12) United States Patent
Takada (10) Patent No.: US 6,722,206 B2
(45) Date of Patent: Apr. 20, 2004

(54) FORCE SENSING MEMS DEVICE FOR SENSING AN OSCILLATING FORCE

(75) Inventor: Akio Takada, Singapore (SG)

(73) Assignee: Sony Precision Engineering Center (Singapore) PTE Ltd., Singapore (SG)

( * ) Notice: Subject to any disclaimer, the term of this patent is extended or adjusted under 35 U.S.C. 154(b) by 0 days.

(21) Appl. No.: 10/160,369

(22) Filed: May 28, 2002

(65) Prior Publication Data

US 2002/0178831 A1 Dec. 5, 2002

(30) Foreign Application Priority Data

May 29, 2001 (SG) .......................................... 200103218

(51) Int. Cl.[7] ................................................ G01L 1/00
(52) U.S. Cl. ........................................ 73/779; 73/777
(58) Field of Search .............................. 73/779, 862.29, 73/862.381, 777; 324/252

(56) References Cited

U.S. PATENT DOCUMENTS

| | | | |
|---|---|---|---|
| 4,414,510 A | * | 11/1983 | Milkovic .................... 324/252 |
| 5,450,372 A | | 9/1995 | Jin et al. |
| 5,586,064 A | | 12/1996 | Grupp |
| 2003/0030527 A1 | * | 2/2003 | Mhani et al. ............... 336/130 |
| 2003/0042902 A1 | * | 3/2003 | Kobayashi et al. ......... 324/252 |

FOREIGN PATENT DOCUMENTS

JP      2000 349363      12/2000

* cited by examiner

Primary Examiner—Edward Lefkowitz
Assistant Examiner—Andre Allen
(74) Attorney, Agent, or Firm—Frommer Lawrence & Haug LLP; William S. Frommer; Gordon Kessler (57) ABSTRACT

An oscillation sensing device includes a magnetised member mounted on a substrate. A magneto-electrical material is mounted on the substrate such that the magneto-electrical material is subjected to the magnetic field generated by the magnetised member. A movable member is mounted for oscillation in response to an oscillating force. Oscillation of the movable member causes a change in the magnetic field experienced by the magneto-electrical material and an electrical property of the electro-electrical material changes in response to changes in the magnetic field experienced by the magneto-electrical material due to oscillation of the movable member.

15 Claims, 7 Drawing Sheets

Flat area can be applied as microphone.

Design for Band Pass Filter

FORCE SENSING MEMS DEVICE FOR SENSING AN OSCILLATING FORCE

BACKGROUND OF THE INVENTION

1. Field of the Invention

The invention relates to a force sensing device, and especially, but not solely, a device for sensing an oscillating force.

Micro-electro mechanical system (MEMS) oscillation sensing devices which convert an oscillating force (or energy) into electric signals are required for a growing number of portable or mobile communication devices. Such MEMS devices include microphones and frequency filters.

2. Description of the Related Art

The majority of MEMS microphones are based on capacitive detection principles. Microphones of this type typically consist of two parallel plates. One of the parallel plates is a compliant diaphragm and is moved when it is subjected to acoustic energy. Hence, the mechanical vibration of the compliant diaphragm caused by the acoustic energy results in a change of capacitance between the two plates. This change in capacitance is detected and output as an electrical signal.

Unfortunately, such capacitance devices generally rely on electrostatic detection which requires a high DC bias voltage. In addition, as the sensitivity of the sensor depends only on the change in the capacitance, it is difficult to design and manufacture high sensitivity devices.

Furthermore, this conventional type of device is fabricated by cutting silicon wavers for each individual device. Therefore, it is difficult or impossible to adjust the sensitivity of the device after fabrication.

SUMMARY OF THE INVENTION

In accordance with the present invention, a force sensing device comprises a magnetised member mounted on a substrate, a magneto-electrical material mounted on the substrate such that the magneto-electrical material is subjected to the magnetic field generated by the magnetised member, a movable member mounted for movement in response to an applied force, movement of the movable member causing a change in the magnetic field experienced by the magneto-electrical material, and an electrical property of the magneto-electrical material changing in response to the change in the magnetic field experienced by the magneto-electrical material due to the movement of the movable member.

In the context of this application, the term "magneto-electrical material" includes any material in which an electrical property of the material changes in response to changes in a magnetic field to which the material is exposed.

Preferably, the magneto-electrical material may comprise a magneto resistive material for example, an anisotropic magneto resistive material, a giant magneto resistive (GMR) material or a tunnel magneto resistive (TMR) material. Alternatively, the magneto-electrical material may comprise a Hall effect material, an inductive sensor or a magneto impedance sensor.

Preferably, the force sensing device may be a micro-electro mechanical system and may be formed on a single chip or die formed from a suitable substrate, such as a silicon wafer. In this case, preferably, the magnetised member comprises a permanent magnetic film formed on a portion of the substrate and the magneto-electrical material is also in the form of a thin film formed on the substrate, such as a magneto resistive alloy film. Typically, the permanent magnetic film may be a cobalt alloy or an iron alloy. Examples of suitable alloys include CoCr, CoPt, CoCrPt, CoCrTa and $\gamma\text{-Fe}_2\text{O}_3$.

In one example of the invention, the magnetised member is mounted on the movable member, so that movement of the movable member moves the magnet to generate the change in the magnetic field to which the magneto-electrical material is exposed.

In another example of the invention, the magnetised member and the movable member may be separate, and typically, the movable member may comprise a soft (or non-permanent) magnetic material.

Typically, the force sensing device is for sensing an oscillating force. However, it may also be used to sense non-oscillating forces, such as acceleration or changes in air pressure.

Preferably, the movable member may be in the form of a cantilevered member or a flexible diaphragm.

If the movable member is intended to undergo oscillation in response to an oscillating electrostatic force generated by an applied oscillating electrical signal (for example, if the force sensing device is to act as a frequency filter) the movable member may comprise a cantilevered member, a pivoting member or a linearly movable member. Typically, the magnetised member is mounted on the movable member.

Alternatively, the magnetised member may be fixed in position relative to the magneto-electrical material and the movable member, comprising a nonpermanent magnetic material, is mounted between the magnetised member and the sensor to move in response to the applied oscillating electrical signal relative to the magnetised member and the magneto-electrical material to generate the change in the magnetic field to which the magneto-electrical material is exposed.

Preferably, where the force sensing device is intended to be used as a frequency filter, the movable member has a resonant frequency, the resonant frequency corresponding to the frequency which the filter is intended to pass.

Typically, two or more force sensing devices may be combined to form a band pass filter where the movable member of each sensing device has a different resonant frequency.

BRIEF DESCRIPTION OF THE DRAWINGS

Examples of a force sensing device in accordance with the invention will now be described with reference to the accompanying drawings, in which.

DETAILED DESCRIPTION OF THE INVENTION

Figure 1:
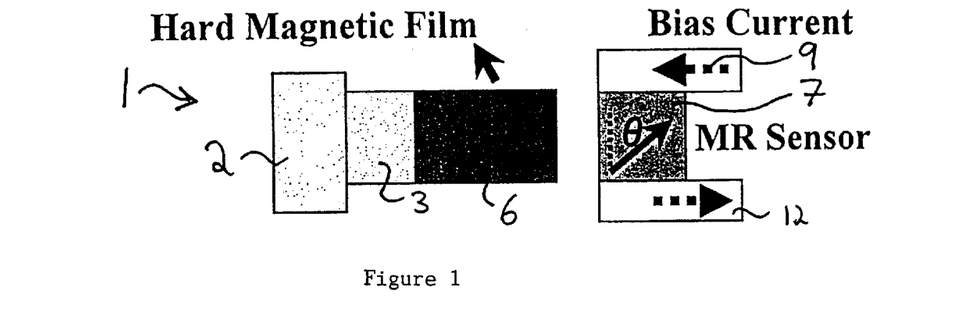
FIG. 1 is a plan view of a force sensing device including a cantilever.
Figure 2:
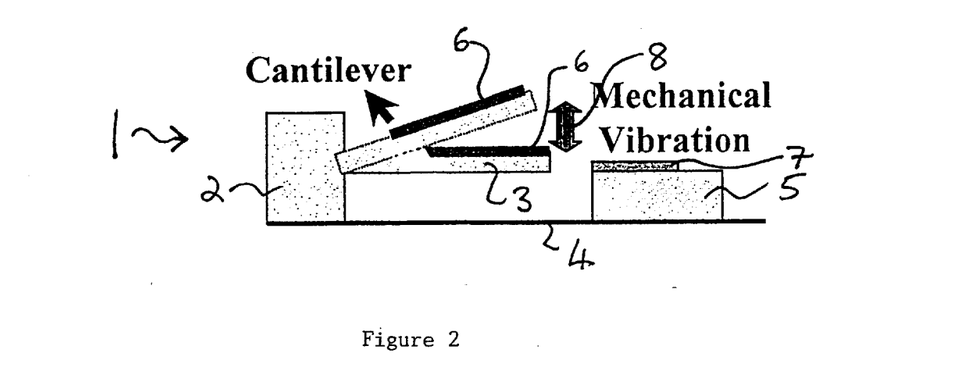
FIG. 2 is a side view of the device shown in FIG. 1.

FIGS. 1 and 2 are a schematic plan and side view, respectively of a force sensing device 1 which illustrate the operating principle. The device 1 includes a support portion 2 that supports a cantilevered member 3. The support member 2 is mounted on a base 4 that also has a sensor support 5 mounted on the base.

The cantilevered member 3 has a hard (or permanent) magnetic thin film 6 formed on its surface. The sensor support member 5 has a thin film of a magneto resistive (MR) material 7 and two contact electrodes 12 formed on the top surface of the sensor support 5 so that the MR thin film 7 is adjacent to but separated from the hard magnetic thin film 6.

Hence, when the cantilevered member 3 moves in either of the directions indicated by arrow 8, the magnetic field experienced by the MR thin film 7 changes which produces a change in the resistivity of the MR thin film 7. This change in resistivity can be detected by a change in a bias current 9 injected through the film 7 via the electrodes 12. The change in resistivity (and therefore, in the bias current 9) corresponds to the movement of the cantilevered member 3 and so the device 1 generates an electrical output in response to the mechanical movement of the member 3.

Figure 3:
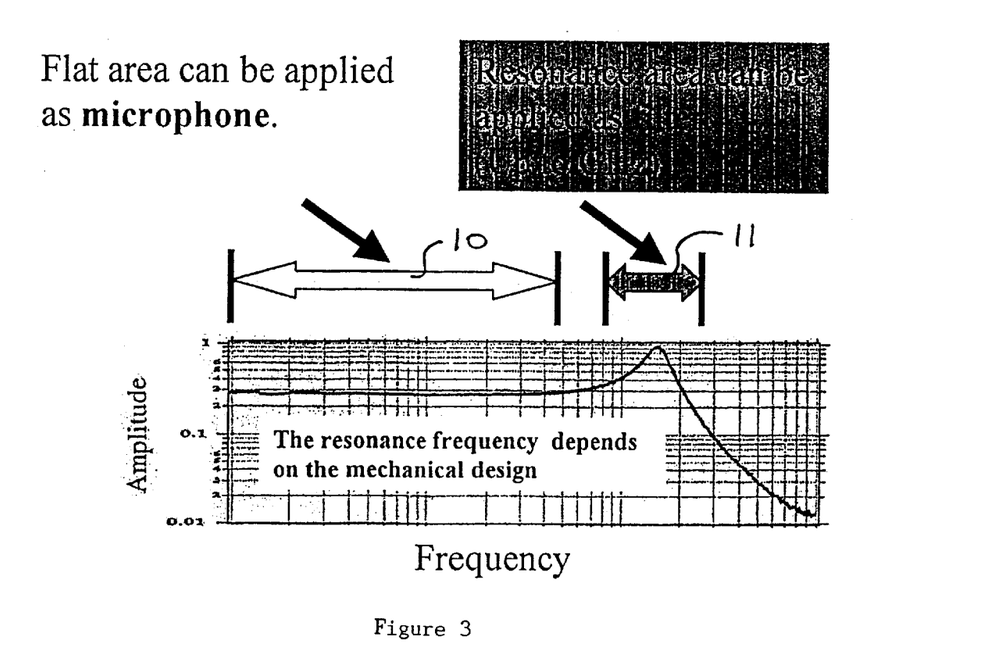
FIG. 3 shows a typical graph of frequency versus amplitude for the cantilever shown in FIGS. 1 and 2.

The resonant frequency of the cantilevered member 3 is dependent on the mechanical design of the cantilevered member 3. A typical graph of frequency versus amplitude of oscillation of the cantilevered member 3 is shown in FIG. 3. The cantilevered member 3 typically has an approximately flat response in the region 10 and rises to a peak in the region 11 before decaying. Hence, the flat response region 10 can be applied to use the device 1 as a microphone and the peak region 11 can be applied to the device 1 to use the device 1 as a frequency filter, such as a surface acoustic wave (SAW) filter. As magneto resistive type sensors generally have a fast response speed, it is possible to use the device 1 as a frequency filter for frequencies up to of the order of Giga-Hertz (GHz). This covers both intermediate frequencies and radio frequencies.

Figure 4:
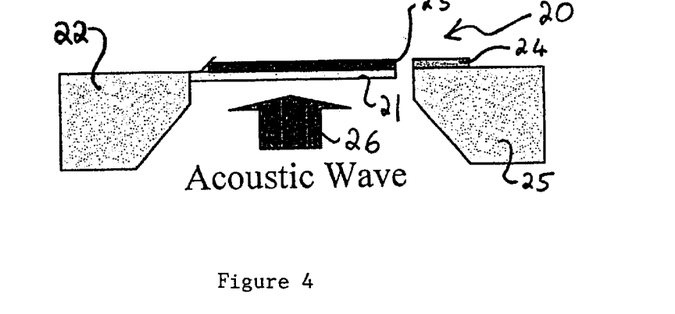
FIG. 4 is a schematic side view of a first example of a microphone.

FIG. 4 shows a first example of a microphone 20 using the operating principle of the device 1 shown in FIGS. 1 and 2. The microphone 20 has a cantilevered member 21 that is attached to a cantilever support 22. Formed on the cantilever 21 is a hard magnetic film 23 and a magneto resistive film 24 is formed on a sensor support 25.

As indicated in FIG. 4, acoustic waves 26 are incident on the cantilevered member 21. Provided that the cantilevered member 3 is designed so that the region 10 is in the range from 20 Hz to 20 kHz, the cantilevered member 21 will oscillate in response to the incident acoustic waves 26 and produce a corresponding oscillation in the resistivity of the magneto resistive film 24. The resulting oscillation in the bias current 9 is directly related to the acoustic waves 26 incident on the cantilevered member 21 and so the microphone 20 converts the acoustic waves 26 to an electrical output signal.

Figure 5:
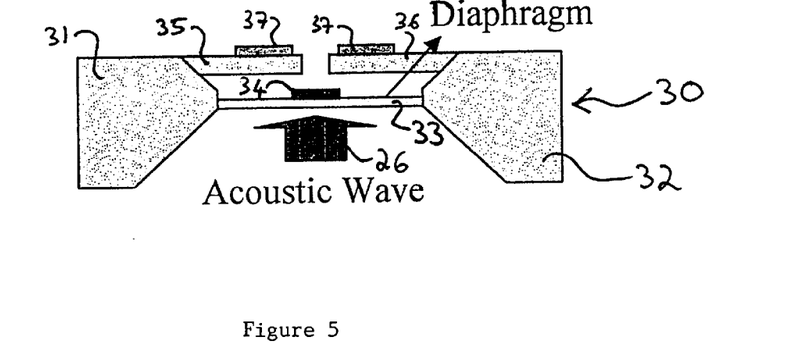
FIG. 5 is a schematic side view of a second example of a microphone.

FIG. 5 shows a second example of a microphone 30. The microphone 30 includes two support members 31, 32 that support a diaphragm 33 on which is formed a hard magnetic film 34. Extending from the support members 31, 32 above the diaphragm 33 are two support projections 35, 36 respectively on which are formed a magneto resistive film 37. The diaphragm 33 is formed such that it is able to flex in response to acoustic waves 26 incident on the diaphragm 33. The acoustic waves 26 cause oscillation of the diaphragm 33 and the hard magnetic film 34 which generates a change in the magnetic field experienced by the magneto resistive films 37. The change in the magnetic field experienced by the magneto resistive films 37 generates a change in the resistivity of the magneto resistive films 37 which produces an oscillation in a bias current injected through the magneto resistive films 37. The oscillation in the bias current is directly related to the oscillation of the acoustic waves 26 incident on the diaphragm 33. Therefore, the microphone 30 converts acoustic waves 26 into an electrical output signal.

Figure 6:
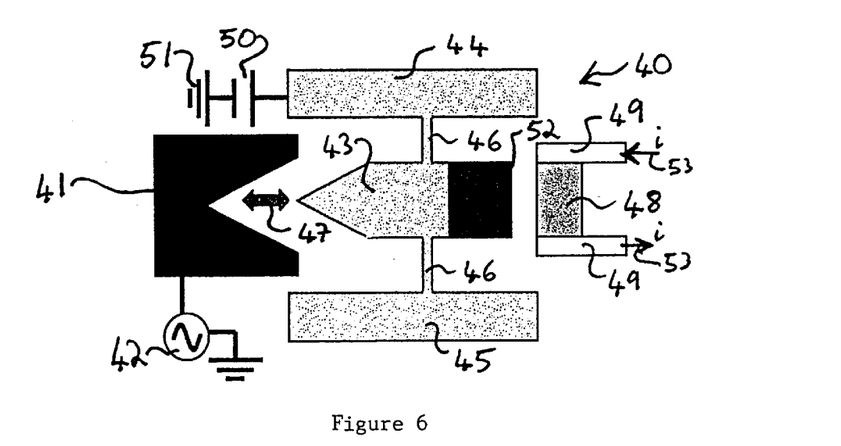
FIG. 6 is a plan view of a first example of a frequency filter.
Figure 7:
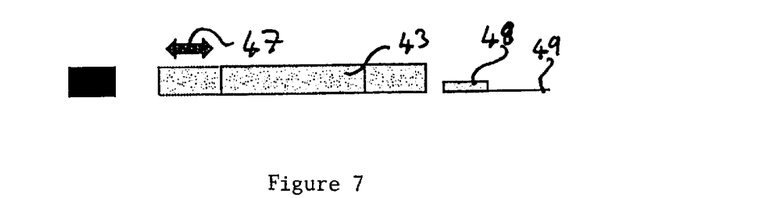
FIG. 7 is a side view of the filter shown in FIG. 6.

FIGS. 6 and 7 show a plan view and a side view, respectively of a frequency filter 40. The filter 40 includes a fixed electrode 41 coupled to a voltage source 42, a movable electrode 43 mounted between two support members 44, 45 by flexible supports 46 which permit movement of the movable electrode 43 in the direction of the arrow 47 in response to an applied force. The filter 40 also includes a magneto resistive film 48 mounted between two electrodes 49. The movable electrode 43 is electrically coupled via the support 44 and capacitor 50 to a ground contact 51. The movable electrode 43 has a hard magnetic film 52 formed on a section of the movable electrode 43 adjacent to the magneto resistive film 48 so that the magneto resistive film 48 is exposed to magnetic field from the hard magnetic film 52.

In use, when an oscillating voltage source 42 is applied to the electrode 41, this generates an oscillating movement of the movable electrode 43 in response to the voltage 42 due to the electrostatic forces between the electrode 43 and the electrode 41. The oscillation of the electrode 43 in the direction of the arrow 47 creates an oscillation in the magnetic field in the magneto resistive film 48 which generates an oscillation in the resistivity of the magneto resistive film 48. The oscillation in the resistivity can be detected by monitoring a bias current 53 injected through the magneto resistive film 48 via the electrodes 49. If the mechanical design of the movable member 43 and the flexible supports 46 is designed such that the movable member 43 resonates at a specific frequency, the movable electrode will oscillate at the specified frequency and so the oscillation in the bias current 53 will also be at the specified frequency. Hence, other frequencies in the oscillating voltage source 42 will be blocked or reduced by the filter 40.

Figure 8:
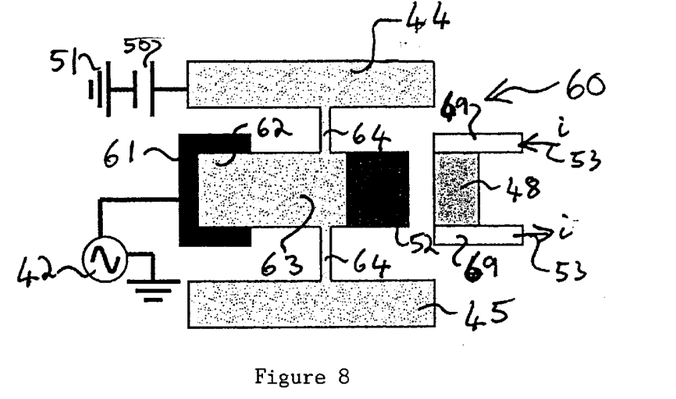
FIG. 8 is a plan view of a second example of a frequency filter.
Figure 9:
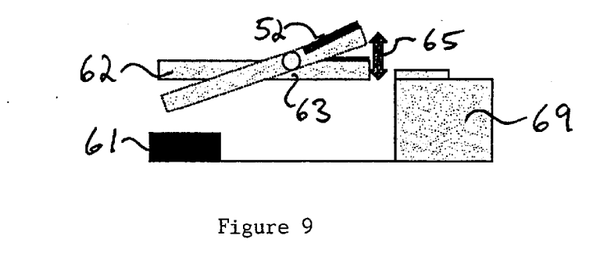
FIG. 9 is a side view of the filter shown in FIG. 8.

FIGS. 8 and 9 show a plan view and a side view respectively of a second example of a filter 60. The filter 60 operates in a similar manner to the filter 40 except that in this instance, a fixed electrode 61 is provided below an end 62 of a movable electrode 63. The movable electrode 63 is supported on the support members 44, 45 by flexible members 64.

In this example, an oscillating voltage source 42 applied to the electrode 61 causes a pivoting movement of the electrode 63 in the direction of arrow 65 so that the hard magnetic film 52 oscillates up and down with respect to the magneto resistive film 48 to cause an oscillation in the resistivity of the magneto resistive film 48. If the mechanical design of the movable electrode 63 and the flexible members 64 is chosen so that the movable electrode 63 resonates at a specific frequency, the filter 60 will act as a frequency filter to pass the specified frequency, which can be detected as an oscillation in the bias current 53, and to block or reduce other frequencies in the voltage source 42.

Figure 10:
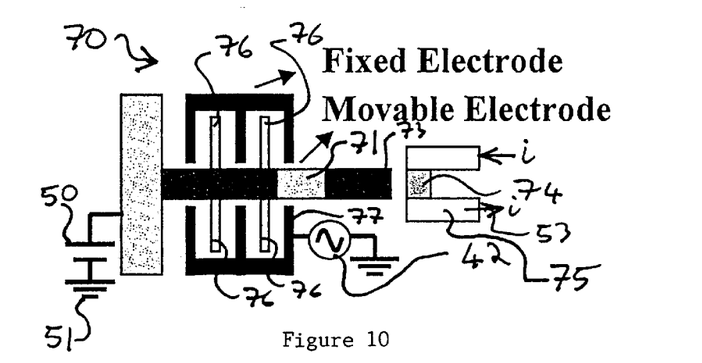
FIG. 10 is a plan view of a third example of a frequency filter.
Figure 11:
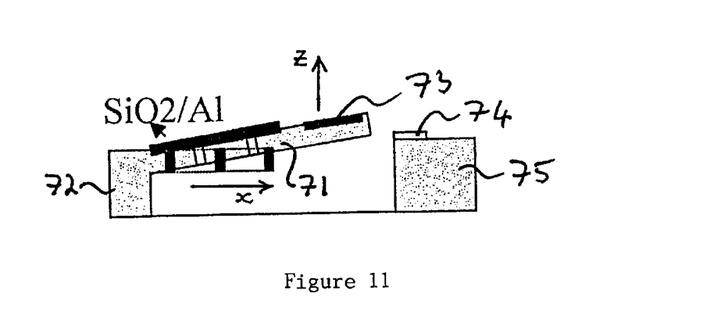
FIG. 11 is a side view of the filter shown in FIG. 10.

FIGS. 10 and 11 show a third example of a filter 70 in which a cantilevered member 71 is supported on a cantilever support 72. The cantilevered member 71 has a hard magnetic film 73 formed on an end adjacent to a magneto resistive film 74 formed on a support member 75. The cantilevered member 71 has a $SiO_2$ and an aluminium films formed on its opposite end. The member 71 also includes four outwardly extending projections 76 which locate within a fixed electrode 77 coupled to the voltage source 42.

The purpose of the $SiO_2$/Al films is to cause the member 71 to bend upwards in the z direction when an electrostatic force is applied in the x direction, as shown in FIG. 11. The bending of the member 71 occurs due to the difference in the material characteristics between the $SiO_2$ film and the aluminium film, as described in Applied Physics Letters, Vol. 76, No. 21, pp 3139–3141, 2000.

Hence, the projections 76 and the cantilevered member 71 form a movable electrode that oscillates in response to the oscillating voltage source 42 applied to the fixed electrode 76. The oscillation of the cantilever 71, and therefore the hard magnetic film 73, causes a corresponding oscillation in the resistivity of the magneto resistive film 74. If the cantilevered member 71 is designed so that it resonates at a specified frequency, the filter 70 acts as a frequency filter to pass the specified frequency, and block or minimise other frequencies.

Figure 12:
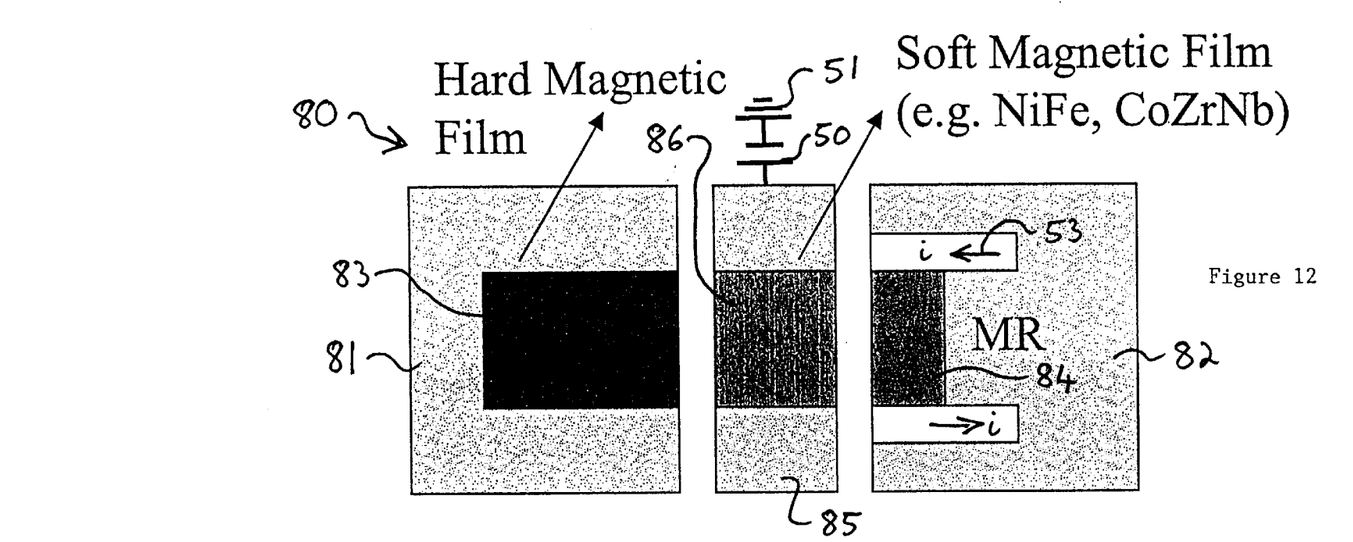
FIG. 12 is a plan view of a fourth example of a frequency filter.
Figure 13:
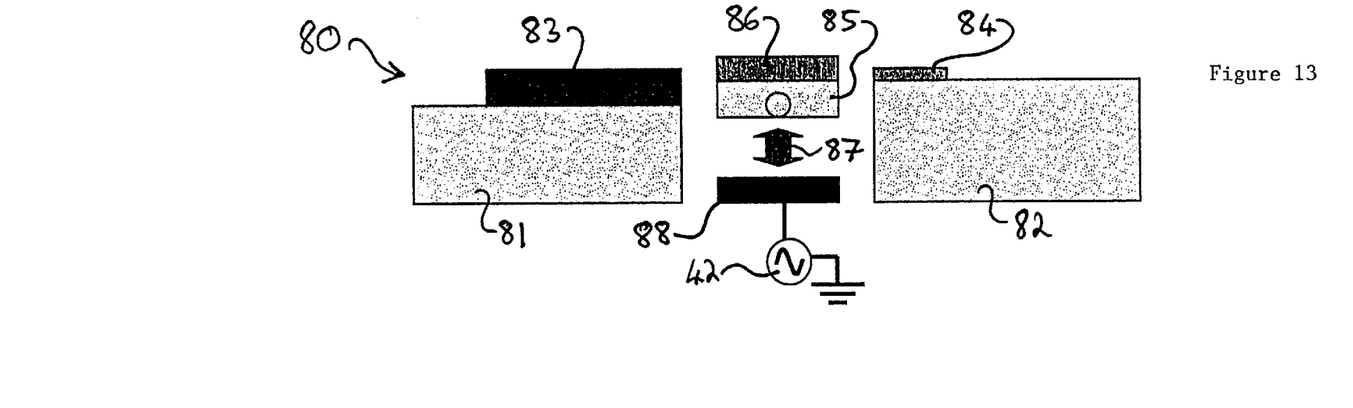
FIG. 13 is a side view of the filter shown in FIG. 12.

FIGS. 12 and 13 show a plan view and a side view respectively of a filter 80. The filter 80 has support members 81, 82 on which are formed a hard magnetic film 83 and a magneto resistive film 84, respectively. Located between the hard magnetic film 83 and the magneto resistive film 84 is a movable electrode 85 on which is formed a soft (or non-permanent) magnetic film 86. For example, the soft magnetic film 86 may be NiFe or CoZrNb. The movable electrode 85 is mounted so that it can move in the direction of arrow 87 relative to a fixed electrode 88, the hard magnetic film 83 and the magneto resistive film 84. The magneto resistive film 84 is close enough to the hard magnetic film 83 to enable the magnetic field from the hard magnetic film 83 to pass through the magneto resistive film 84. In response to an oscillating voltage applied to the fixed electrode 88 by the voltage source 42, the movable electrode 85 oscillates in the direction of the arrow 87. As the soft magnetic film 86 oscillates through the magnetic field produced by the hard magnetic film 83, the soft magnetic film 86 produces an oscillation in the magnetic field experienced by the magneto resistive film 84 to produce a corresponding oscillation in the resistivity of the magneto resistive film 84. If the movable electrode 85 is designed so that it resonates at a specific frequency, the filter 80 will act as a frequency filter to pass the specific frequency, which can be obtained as an oscillating output signal on the bias current 53, and the filter 80 will act to block or minimise other frequencies.

Figure 14:
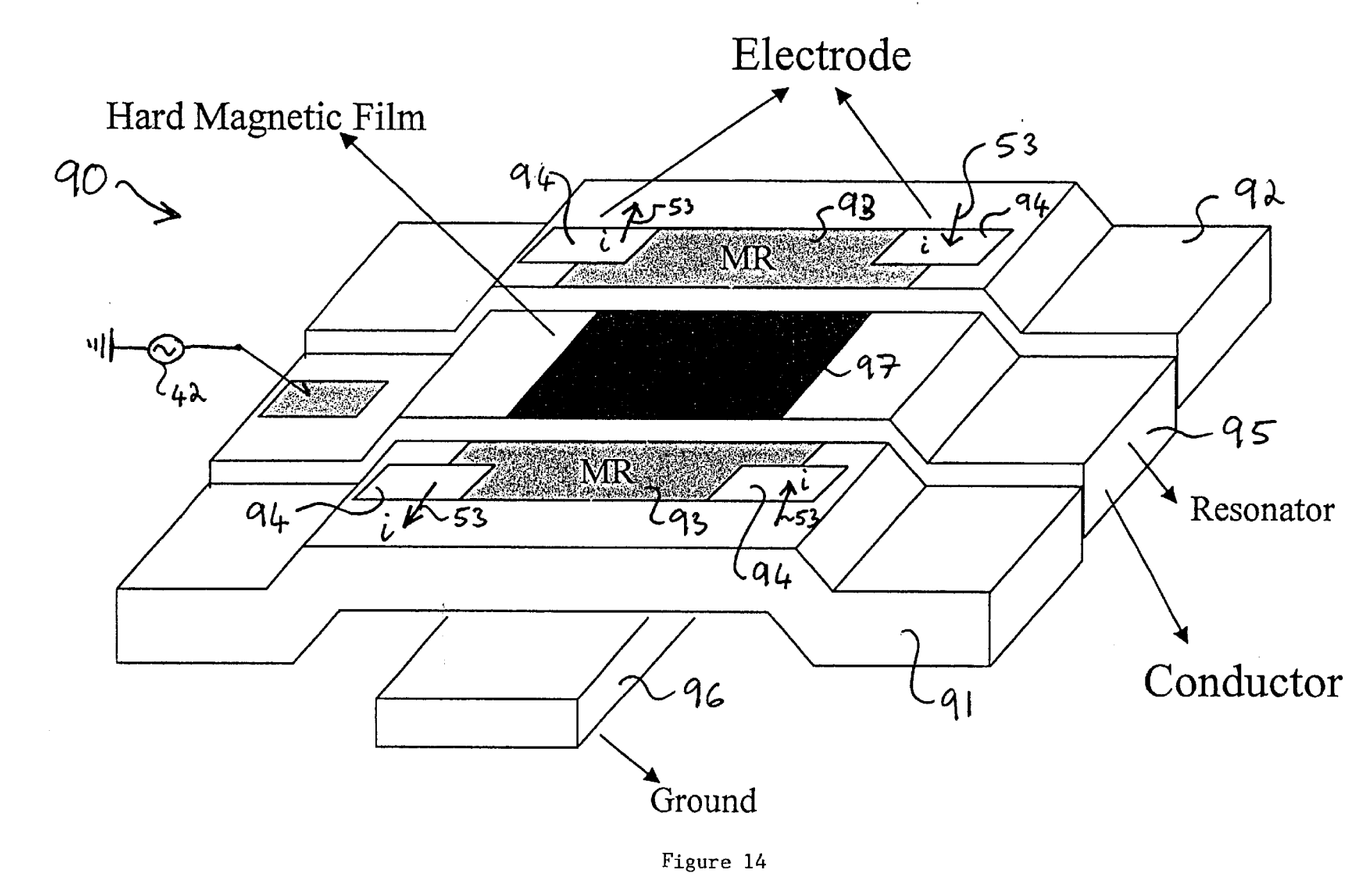
FIG. 14 is a perspective view of a fifth example of a frequency filter.

FIG. 14 shows a perspective view of a fifth example of a filter 90 which includes two fixed supports 91, 92 on each of which is formed a magneto resistive film 93 and a pair of electrodes 94 for injecting a bias current 53 through the magneto resistive film 93. Located between the fixed supports 91, 92 is a movable electrode 95 which is coupled to an oscillating signal source 42. The moveable electrod 95 has a hard magnetic film 97 formed on it. A ground electrode 96 is located below the electrode 95. The movable electrode 95 is mounted to permit vertical oscillation of the movable electrode 95 with respect to the ground electrode 96 and the magneto resistive films 93. Hence, when the oscillating signal source 42 is applied to the movable electrode 95, this generates a vertical oscillation of the movable electrode 95 which causes a corresponding oscillation in the magnetic field experienced by the magneto resistive films 93 and therefore, an oscillation in the resistivity of the magneto resistive films 93. The oscillation in the resistivity of the magneto resistive films 93 can be detected as an oscillating signal on the bias current 53 injected through the magneto resistive films 93. If the mechanical design of the movable electrode 95 and the mounting of the movable electrode 95 is such that the movable electrode 95 oscillates at a specific frequency, the filter 90 will act as a frequency filter to pass the specified frequency from the oscillating signal source 42 but will block or minimise other frequencies in the oscillating signal source 42.

Figure 15:
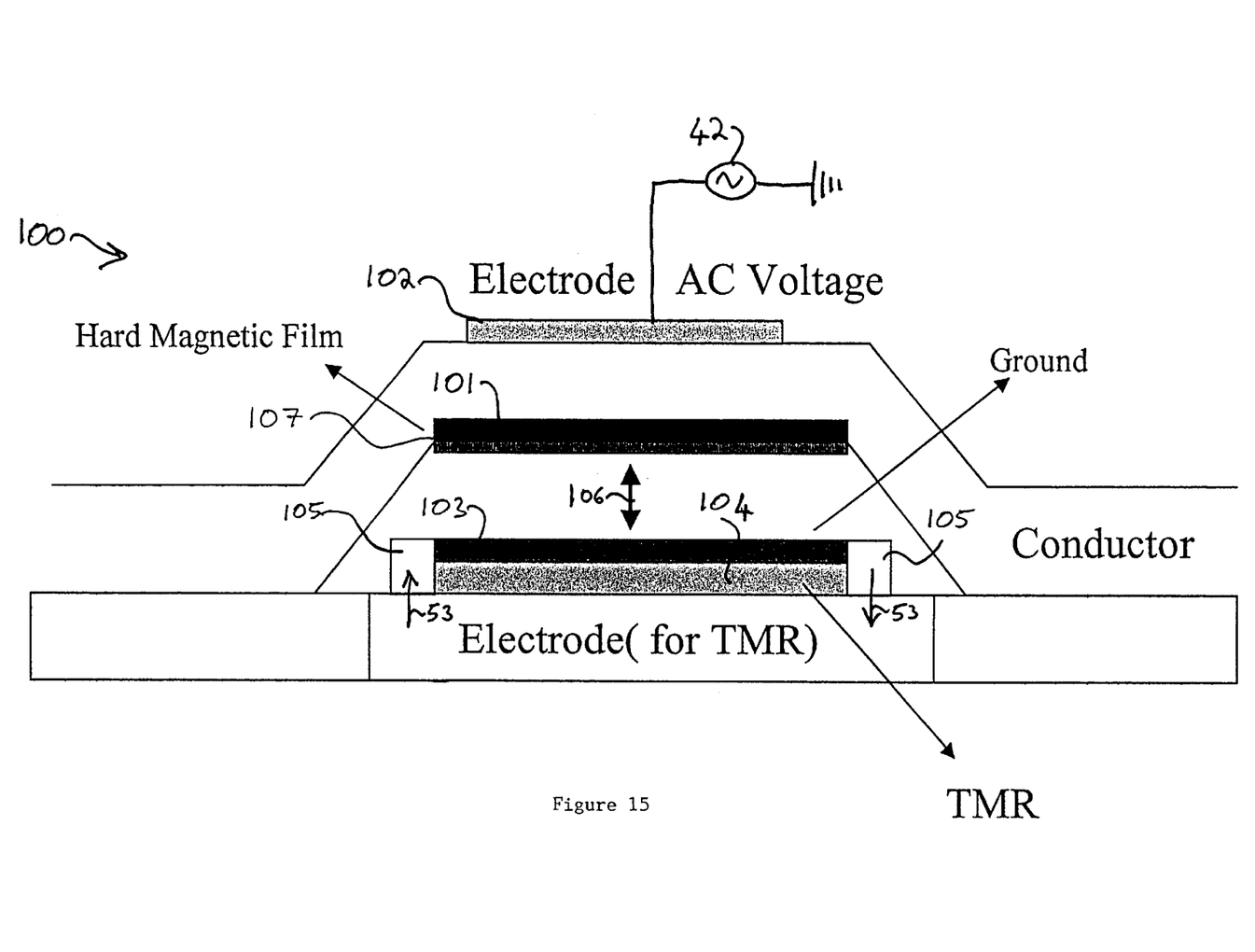
FIG. 15 is a side view of a sixth example of a filter.

FIG. 15 shows a side view of a sixth example of a filter 100 which has a hard magnetic film 101 formed on a movable electrode 107. The electrode 107 is movably mounted between a fixed electrode 102 and a base structure comprising a ground electrode 103, a tunnel magneto resistive (TMR) film 104 and an electrode 105 for the TMR film 104. In this example, an oscillating signal source 42 applied to the fixed electrode 102 causes an oscillating motion of the movable electrode 107 (and therefore, the hard magnetic film 101) in the direction of the arrow 106, which causes an oscillation in the magnetic field experienced by the TMR film 104. As in the previous examples, the oscillation in the magnetic field experienced by the TMR film 104 causes an oscillation in resistivity of the TMR film 104 which can be detected as an oscillating signal on the bias current 53 injected through the TMR film 104 via the electrodes 105. If the mechanical design of the movable electrode 107 is chosen so that it resonates at a specific frequency, the filter 100 will pass the specified frequency from the oscillating signal source 42 and block or minimise other frequencies from the oscillating signal source 42.

In each of the above examples, the hard magnetic film may be any suitable hard magnetic film material. For example, a cobalt alloy such as CoCr, CoPt, CoCrPt, CoCrTa or an iron alloy such as $\gamma$-$Fe_2O_3$. Although in the examples described above, the magneto-electrical material is a magneto resistive material, or in the case of the filter 100 a TMR material, it is possible that any suitable magneto-electrical material could be used. For example, the sensing material may be a Hall sensor, an inductive sensor or a magneto impedance (MI) sensor.

Preferably, all the above described microphones and filters are manufactured using micro-electro mechanical system (MEMS) technology. Therefore, they have the advantage that they can be formed on a single die and that a number of dies can be formed on one silicon waver in order to facilitate mass production of the microphones and filters. In addition, it is possible to tune the sensitivity of the microphones and filters by modifying the magnetic field strength and direction of the hard magnetic film.

The microphones and filters described above also have the advantage that it is possible to obtain a sensitivity of approximately 3.5 mV/Pa for an applied voltage of 0.5 V.

This is based on a typical magneto resistive material with a resistance of 50 Ω and Δρ/ρ of 2.7%. This is approximately 10% of the applied voltage that would be required for a conventional capacitance device to obtain a similar level of sensitivity.

Figures 16, 17:
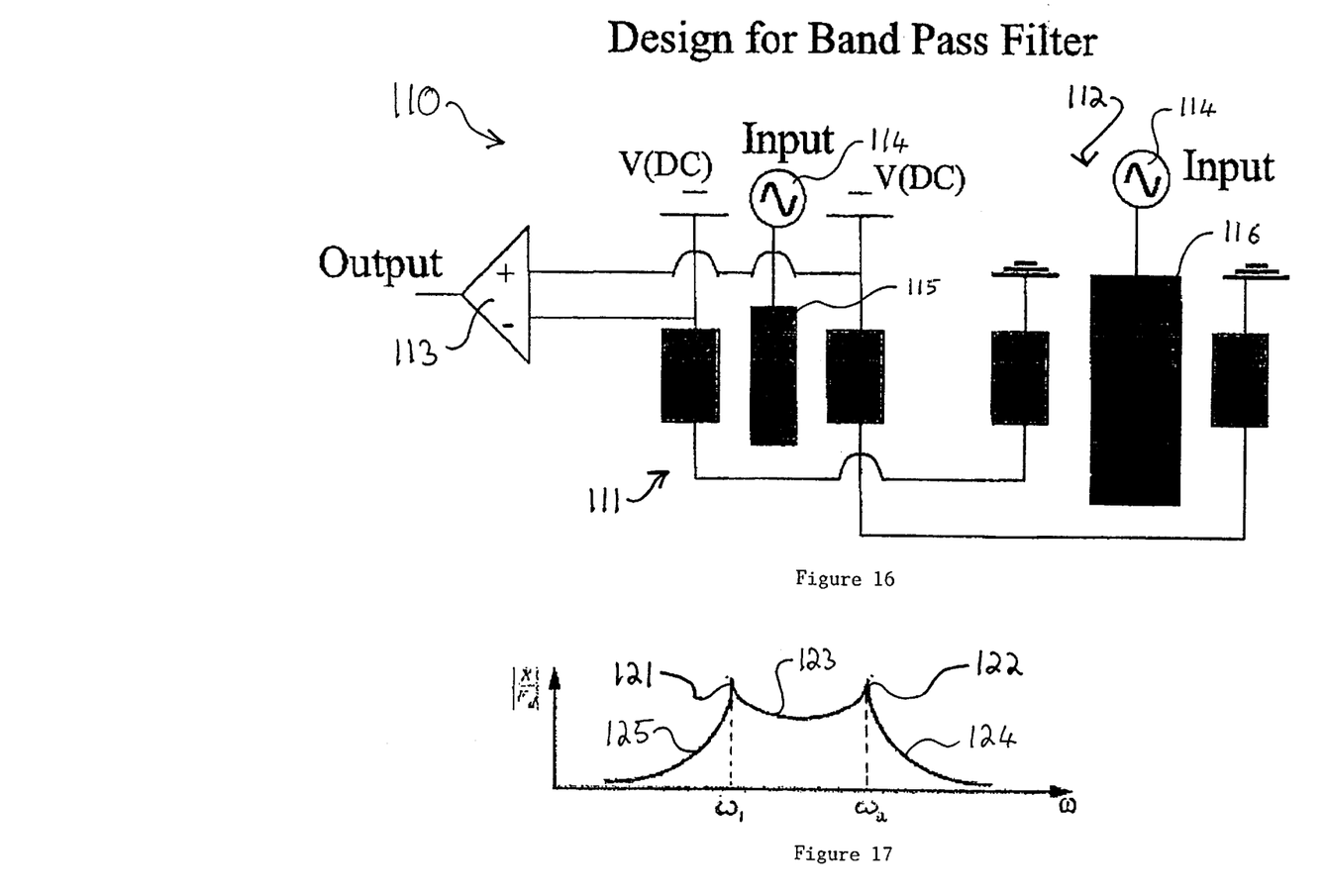
FIG. 16 is a schematic view of a band pass filter using the filter design shown in FIG. 14.
FIG. 17 is a graph of the output from the band pass filter showing frequency versus amplitude.

FIG. 16 shows an example of a band pass filter 110 using a filter design similar to that shown in FIG. 14. The band pass filter 110 comprises two filters 111, 112 which are designed to resonate at frequencies $\omega_1$, $\omega_2$ respectively. The filters 111, 112 receive the same oscillating input signal 114, which is applied to a respective movable electrode 115, 116. Outputs from the filters 111, 112 are coupled to an operational amplifier 113.

When the input signal 114 is applied to the movable members 115, 116, the movable members 115, 116 will respond primarily to frequencies in the input signal corresponding to their respective resonant frequency $\omega_1$, $\omega_2$. Hence, the filter 111 will pass frequencies at around $\omega_1$ to the operational amplifier 113 and block other frequencies and the filter 112 will pass frequencies at around $\omega_2$ to the operational amplifier and block other frequencies. Therefore, the resulting output from the band pass filter 110 is the sum of the outputs from the filters 111, 112.

This is shown graphically in FIG. 17 where it can be seen that the output has peaks 121, 122 corresponding to the frequencies $\omega_1$, $\omega_2$ and also passes frequencies 123 between the frequencies $\omega_1$ and $\omega_2$. FIG. 17 also shows that frequencies 124 above $\omega_2$ and frequencies 125 below $\omega_1$ are blocked by the band pass filter 110.

What is claimed is:

1. A force sensing device comprises a movable member mounted for movement relative to a substrate in response to an applied force, a magnetised member mounted on the moveable member, and a magneto-electrical material mounted on the substrate such that the magneto-electrical material is subjected to the magnetic field generated by the magnetised member, movement of the moveable member causing a change in the magnetic field experienced by the magneto-electrical material, and an electrical property of the magneto-electrical material changing in response to changes in the magnetic field experienced by the magneto-electrical material due to movement of the moveable member.

2. A device according to claim 1, wherein the magneto-electrical material comprises a magneto resistive material.

3. A device according to claim 1, wherein the movable member is a micro-electro mechanical system.

4. A device according to claim 1, wherein the magnetised member and the magneto-electrical material are both in the form a thin film.

5. A device according to claim 1, wherein the movable member comprises a soft magnetic material.

6. A device according to claim 1, wherein the movable member comprises a cantilevered member.

7. A device according to claim 1, wherein the movable member comprises a linearly movable member.

8. A device according to claim 1, wherein the movable member comprises a pivotable member.

9. A device according to claim 1, wherein the movable member is adapted for oscillating movement in response to an oscillating force.

10. A device according to claim 10, wherein the oscillating force is an acoustic force.

11. A microphone comprising a device according to claim 10.

12. A frequency filter comprising a device according to claim 1, wherein the movable member has a resonating frequency.

13. A band pass filter comprising two frequency filters according to claim 12, wherein the frequency filters have different resonating frequencies and the outputs of the frequency filters are coupled together.

14. A force sensing device comprises a magnetised member mounted on a substrate, a magneto-electrical material mounted on the substrate such that the magneto-electrical material is subjected to the magnetic field generated by the magnetised member, a movable member mounted for movement in response to an applied force, movement of the moveable member causing a change in the magnetic field experienced by the magneto-electrical material, and an electrical property of the magneto-electrical material changing in response to changes in the magnetic field experienced by the magneto-electrical material due to movement of the moveable member wherein the movable member has a resonating frequency.

15. A force sensing device comprises a magnetised member mounted on a substrate, a magneto-electrical material mounted on the substrate such that the magneto-electrical material is subjected to the magnetic field generated by the magnetised member, a movable member mounted for movement in response to an applied force, movement of the moveable member causing a change in the magnetic field experienced by the magneto-electrical material, and an electrical property of the magneto-electrical material changing in response to changes in the magnetic field experienced by the magneto-electrical material due to movement of the moveable member wherein the frequency filters have different resonating frequencies and the outputs of the frequency filters are coupled together.

* * * * *